(12) United States Patent
Matsumoto et al.

(10) Patent No.: US 8,481,249 B2
(45) Date of Patent: Jul. 9, 2013

(54) METHOD FOR MANUFACTURING RECORDING HEAD

(75) Inventors: Keiji Matsumoto, Yokohama (JP); Kazuhiro Asai, Kawasaki (JP); Tetsuro Honda, Oita (JP); Kunihito Uohashi, Yokohama (JP); Shuji Koyama, Kawasaki (JP); Masaki Ohsumi, Yokosuka (JP)

(73) Assignee: Canon Kabushiki Kaisha, Tokyo (JP)

( * ) Notice: Subject to any disclaimer, the term of this patent is extended or adjusted under 35 U.S.C. 154(b) by 0 days.

(21) Appl. No.: 13/540,960

(22) Filed: Jul. 3, 2012

(65) Prior Publication Data

US 2013/0017496 A1    Jan. 17, 2013

(30) Foreign Application Priority Data

Jul. 14, 2011   (JP) ................... 2011-155733

(51) Int. Cl.
*B41J 2/16*    (2006.01)
(52) U.S. Cl.
USPC ............................. 430/320; 430/330
(58) Field of Classification Search
None
See application file for complete search history.

(56) References Cited

U.S. PATENT DOCUMENTS

| 5,331,344 A | 7/1994 | Miyagawa et al. |
| 6,162,589 A * | 12/2000 | Chen et al. ............. 430/320 |
| 7,481,942 B2 | 1/2009 | Min et al. |
| 2003/0087199 A1 * | 5/2003 | Kim et al. ............. 430/320 |
| 2006/0284933 A1 * | 12/2006 | Hatta .................... 347/56 |

FOREIGN PATENT DOCUMENTS

| JP | 4-216951 A | 8/1992 |
| JP | 2003-311975 A | 11/2003 |
| JP | 4195347 B2 | 3/2004 |
| JP | 2005-125619 A | 5/2005 |

* cited by examiner

*Primary Examiner* — John A. McPherson
(74) *Attorney, Agent, or Firm* — Fitzpatrick, Cella, Harper & Scinto

(57) ABSTRACT

A method for manufacturing a recording head including forming a flow-channel side-wall forming layer which contains a photosensitive resin, on a substrate having ejection energy generating elements and wiring thereon; exposing the flow-channel side-wall forming layer to light, and optically determining a flow channel; forming a shape stabilizing layer which contains a photosensitive resin; forming an ejection orifice forming layer which contains a photopolymerization initiator and a negative photosensitive resin; exposing the ejection orifice forming layer to light, and optically determining an ejection orifice; and developing the ejection orifice forming layer, shape stabilizing layer, and flow-channel side-wall forming layer, in the order named. The photosensitive resin in the shape stabilizing layer is a material to be cured by a component that is produced upon the exposure of the ejection orifice forming layer and derives from the photopolymerization initiator.

6 Claims, 3 Drawing Sheets

METHOD FOR MANUFACTURING RECORDING HEAD

BACKGROUND OF THE INVENTION

1. Field of the Invention

The present invention relates to a method for manufacturing a recording head which is used for performing recording by using a liquid such as ink.

2. Description of the Related Art

Conventionally, a method for manufacturing a recording head is disclosed in Japanese Patent Application Laid-Open No. H04-216951, which includes forming a flow channel and an ejection orifice by setting a sensitivity ratio in photoresists to be stacked, stacking the photoresists so as not to deform a flow channel of a lower layer, which flow channel has been optically determined, exposing the upper layer to light, and collectively developing the lower layer and the upper layer. In addition, a method for manufacturing the recording head is disclosed in Japanese Patent No. 4195347, which includes forming a flow channel and an ejection orifice by providing an exposure stoppage layer which is formed of a photoresist that intercepts ultraviolet light, between an upper layer and a lower layer, stacking the photoresist so as not to deform a flow channel of the lower layer, which flow channel has been optically determined, exposing the upper layer to light, and developing the lower layer and the upper layer.

However, in the methods for manufacturing a recording head described in Japanese Patent Application Laid-Open No. H04-216951 and Japanese Patent No. 4195347, the photoresist containing a polymerization initiator which initiates the polymerization of the lower layer is stacked on and comes in contact with an unexposed portion that has been optically determined and will form a flow channel. For this reason, there has been a concern that polymerization initiating species which have been produced from a photopolymerization initiator contained in the stacked photoresist diffuse into the unexposed portion in the above described lower layer, which unexposed portion will be a flow channel, and result in causing a polymerization reaction. In other words, there has been a concern that an actual height of the flow channel results in being lower than the desired height. Specifically, there has been a concern that, as is shown in FIG. 4, the actual height of the flow channel is made lower than the desired height of the flow channel because the substance which causes the polymerization of the above described unexposed portion in the lower layer invades into the unexposed portion to form a cured portion 15.

SUMMARY OF THE INVENTION

An object of the present invention is to provide a method for manufacturing a recording head that is excellent in refilling properties of a liquid to be ejected, which can form the flow channel so as to have a desired height in an adequate yield.

The present invention provides a method for manufacturing a recording head includes the steps of: (1) forming a layer for forming a side wall of a flow channel (referred to also as flow-channel side-wall forming layer) which contains a photosensitive resin, on a substrate that has ejection energy generating elements and wiring thereon; (2) exposing the flow-channel side-wall forming layer to light, and optically determining a flow channel; (3) forming a shape stabilizing layer which contains a photosensitive resin, on the flow-channel side-wall forming layer; (4) forming a ejection orifice forming layer which contains a photopolymerization initiator and a negative photosensitive resin, on the shape stabilizing layer; (5) exposing the ejection orifice forming layer to light, and optically determining an ejection orifice; and (6) developing the ejection orifice forming layer, the shape stabilizing layer, and the flow-channel side-wall forming layer, in the order of the steps (1) to (6), wherein the photosensitive resin which is contained in the shape stabilizing layer is a material to be cured by a component that is produced upon the exposure of the ejection orifice forming layer and derives from the photopolymerization initiator.

Further features of the present invention will become apparent from the following description of exemplary embodiments with reference to the attached drawings.

BRIEF DESCRIPTION OF THE DRAWINGS

Following FIGS. 1A, 1B, 1C and 1D, FIGS. 2E, 2F, 2G and 2H are schematic sectional views illustrating the method for manufacturing the recording head of the present embodiment.

DESCRIPTION OF THE EMBODIMENTS

Embodiments of the present invention will now be described in detail in accordance with the accompanying drawings.

Figure 3:
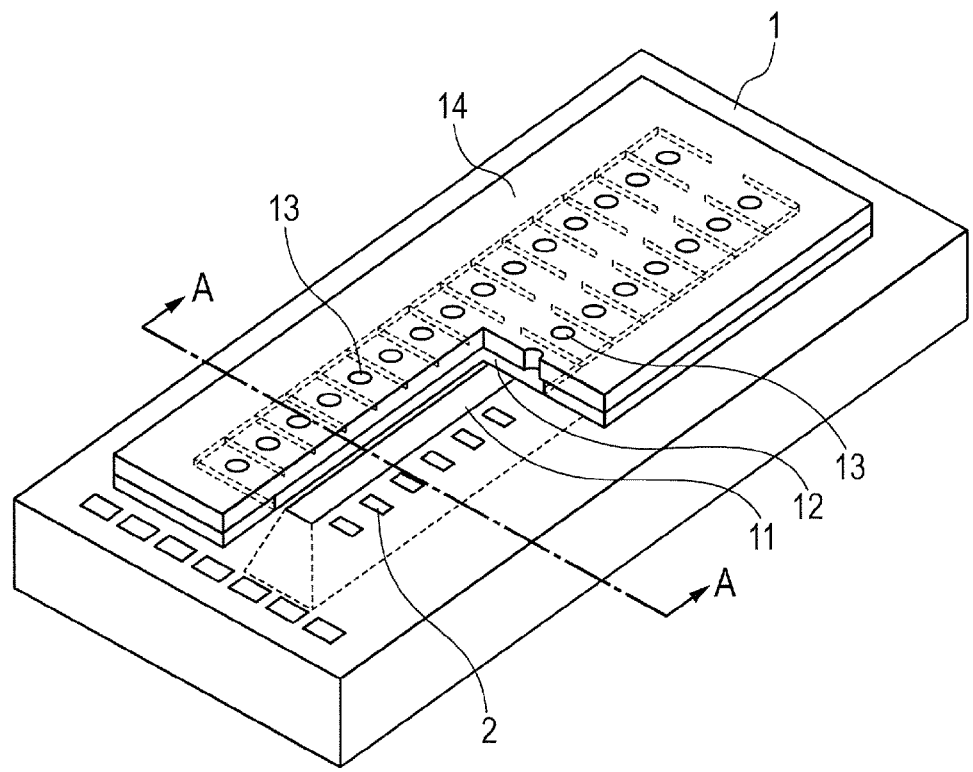
FIG. 3 is a schematic perspective view illustrating an example of a recording head of the present embodiment.
Figure 4:
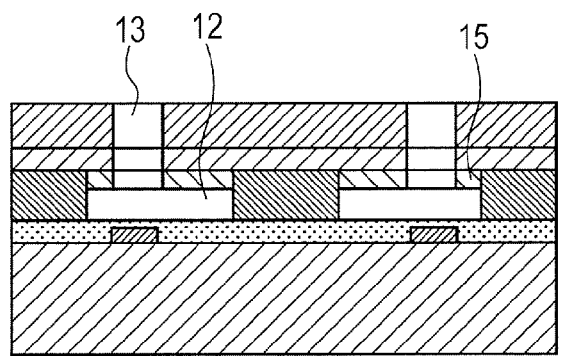
FIG. 4 is a schematic sectional view illustrating a method for manufacturing a recording head according to a conventional technology.

FIG. 3 is a schematic perspective view illustrating an example of a recording head of the present embodiment. The ink jet recording head illustrated in FIG. 3 has a silicon substrate 1 on which ejection energy generating elements 2 are arrayed in two rows at a predetermined pitch. The ejection energy generating elements 2 generate ink-ejecting pressure energy. A polyether amide layer (not shown) is formed as an adhesive layer on the silicon substrate 1. Furthermore, side walls of flow channels, and an ejection orifice forming layer 14, which is provided with ejection orifices 13 that are positioned above the ejection energy generating elements 2, are formed on the silicon substrate 1. Though being not shown, a shape stabilizing layer is also disposed between the side walls of the flow channels and the ejection orifice forming layer 14. In addition, on the silicon substrate 1, an ink supply port 11 is formed between the rows of the ejection energy generating elements 2. Furthermore, an ink flow channel 12 which communicates with the ink supply port 11 and each ejection orifice 13 is formed on the substrate. When a pressure is applied to an ink (liquid) which has been filled in the ink flow channels from the ink supply port 11, by the ejection energy generating elements 2, ink droplets are ejected from the ejection orifices 13. Recording is performed by causing these ink droplets to adhere to a recording medium.

In the present specification including the description of FIG. 3, an ink jet recording head will be taken as an application example of the present invention. However, the scope to which the present invention is applied is not limited thereto, but the present invention can be applied also to a recording head or the like for use in manufacturing a biochip and printing an electronic circuit. The recording head includes also a head for manufacturing a color filter, for instance, in addition to the ink jet recording head.

The method for manufacturing a recording head according to the present invention using the shape stabilizing layer will be described below with reference to FIG. 1.

FIGS. 1A to 1D and FIGS. 2E to 2H are schematic sectional views of the recording head, which are taken along the cutting line A-A of FIG. 3.

Figure 1A:
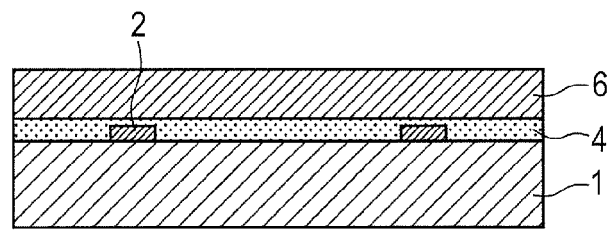
FIGS. 1A, 1B, 1C and 1D are schematic sectional views illustrating a method for manufacturing a recording head of the present embodiment.

A plurality of ejection energy generating elements 2 are arranged on the substrate 1 illustrated in FIG. 1A, and an insulative protection film 4 is formed thereon. Firstly, a layer for forming a side wall of a flow channel, or flow-channel side-wall forming layer 6, which is formed of a photosensitive resin, is formed on the insulative protection film 4 by a spin coating method or the like.

Here, the flow-channel side-wall forming layer contains the photosensitive resin. The photosensitive resin to be used can include a negative photosensitive resin. Furthermore, the flow-channel side-wall forming layer can contain a photopolymerization initiator. In the present specification, the photopolymerization initiator is described according to a concept that the photopolymerization initiator includes not only a material which promotes a polymerization reaction but also a material which promotes a crosslinking reaction. The negative photosensitive resin to be used for the flow-channel side-wall forming layer is not limited in particular, but includes, for instance, a cyclized polyisoprene containing a bisazido compound, a cresol novolak resin containing azidopyrene, and an epoxy resin containing a diazonium salt or an onium salt.

In addition, the negative photosensitive resin to be used for the flow-channel side-wall forming layer is not limited in particular, but can employ, for instance, a bisphenol A type epoxy resin and a cresol novolak type epoxy resin.

For information, as an alternative method, the flow-channel side-wall forming layer 6 may also be formed of a negative type of photosensitive dry film which is a photosensitive resin, by a lamination method.

The flow-channel side-wall forming layer contains the negative photosensitive resin. The negative photosensitive resin includes, for instance, an epoxy resin. In addition to the epoxy resin, the negative photosensitive resin contains a photoinduced cationic polymerization initiator and a solvent such as xylene.

In addition, a polyether-amide-based resin may also be formed as an adhesion-enhancing layer on the insulative protection film 4, before the flow-channel side-wall forming layer 6 is formed.

Figure 1B:
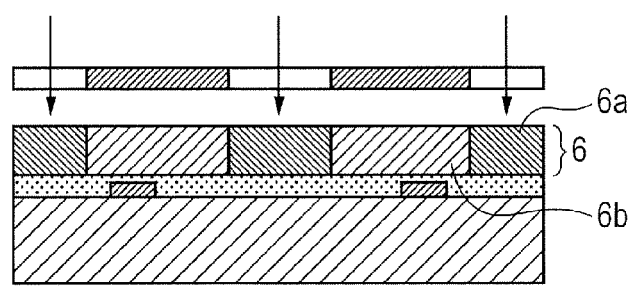

Next, as illustrated in FIG. 1B, a portion of the flow-channel side-wall forming layer 6 to be the side walls of the flow channel is exposed to light, and a cured portion 6a and an unexposed portion 6b are optically determined.

FIG. 1B illustrates an embodiment when the negative photosensitive resin is used, and accordingly, the portion exposed to light becomes the cured portion 6a. The cured portion 6a corresponds to the side wall of the flow channel.

Figure 1C:
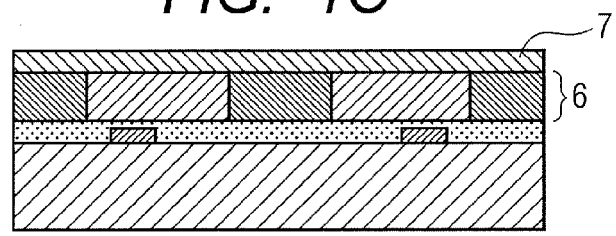

Next, as illustrated in FIG. 1C, the shape stabilizing layer 7 containing a photosensitive resin is formed on the flow-channel side-wall forming layer 6, in which the side walls of the flow channel and the flow channels have been optically determined.

The photosensitive resin contained in the shape stabilizing layer 7 is a material which is cured by virtue of a component that derives from the photopolymerization initiator contained in an ejection orifice forming layer in a post-process, and that is produced upon the exposure of the ejection orifice forming layer.

The shape stabilizing layer 7 will be now described more in detail below. The shape stabilizing layer 7 contains a photosensitive resin, and does not contain such a polymerization initiator as to cure the unexposed portion in the flow-channel side-wall forming layer. More specifically, the shape stabilizing layer 7 does not contain polymerization initiators which react with the unexposed portion 6b in the flow-channel side-wall forming layer, such as a photoacid generating agent including an onium salt and a diazonium salt, and a radical polymerization initiator including a titanocene compound and a p-nitrobenzyl aromatic sulfonate. Accordingly, the polymerization initiators do not diffuse into the unexposed portion in the flow-channel side-wall forming layer, and as a result, the flow channel can be formed so as to have a desired height. The shape stabilizing layer 7 as a single layer cannot be patterned by photolithography, but is cured by virtue of the component which derives from the photopolymerization initiator that is used for the ejection orifice forming layer, as described above.

In addition, the shape stabilizing layer 7 is preferably formed of a material which has lower compatibility with the adjacent, flow-channel side-wall forming layer 6.

The component which derives from the photopolymerization initiator contained in the ejection orifice forming layer and is produced upon the exposure of the ejection orifice forming layer includes, for instance, a cationic species and a radical species. In the exposed portion in the ejection orifice forming layer, the cationic species and the radical species are produced, and diffuse into the shape stabilizing layer 7 portion in a region corresponding to the exposed portion. The above described component which has diffused into the shape stabilizing layer 7 cures the photosensitive resin of the shape stabilizing layer. The photosensitive resin to be used for the shape stabilizing layer is not limited in particular, but can employ, for instance, a bisphenol A type epoxy resin and a cresol novolak type epoxy resin. It is desirable that the photosensitive resin to be used for the shape stabilizing layer is appropriately selected in consideration of the photopolymerization initiator contained in the negative photosensitive resin to be used for the ejection orifice forming layer.

The thickness of the shape stabilizing layer 7 can be selected in consideration of the diffusion length of the cationic species and the radical species which derive from the photopolymerization initiator to be used for the ejection orifice forming layer, and can be, for instance, approximately 0.5 μm to 3 μm.

The shape stabilizing layer can be formed by using a dry film. This is because when the shape stabilizing layer is formed by the dry film, patterns of the cured portion and the unexposed portion in the flow-channel side-wall forming layer are hardly to be deformed.

Figure 1D:
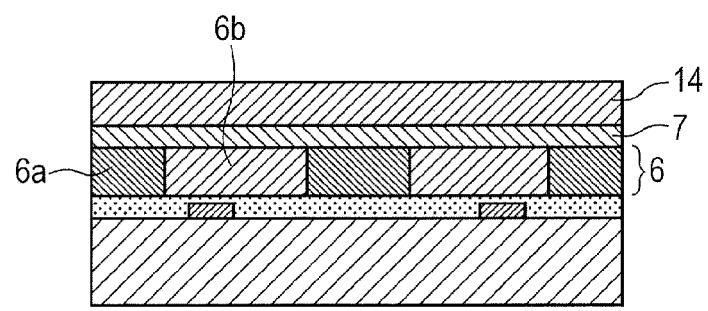

Next, as illustrated in FIG. 1D, the ejection orifice forming layer 14 containing the photopolymerization initiator and the negative photosensitive resin is formed on the shape stabilizing layer 7 which has been formed in FIG. 1C.

As described above, the component produced from the photopolymerization initiator to be used for the ejection orifice forming layer diffuses into the shape stabilizing layer, and causes a resist of the shape stabilizing layer to cure.

The negative photosensitive resin to be used for the ejection orifice forming layer includes, for instance, a bisphenol A type epoxy resin and a cresol novolak type epoxy resin. The photopolymerization initiator to be used for the ejection orifice forming layer includes, for instance, a diazonium salt and an onium salt.

Here, the ejection orifice forming layer 14 can be formed by using a dry film resist, but may also be formed by a spin coating method or the like, if the patterns of the cured portion 6a and the unexposed portion 6b which have been formed in the flow-channel side-wall forming layer 6 are not deformed.

The sensitivity of the ejection orifice forming layer 14 can have such a sensitivity ratio that the unexposed portion 6b in the flow-channel side-wall forming layer 6 is not cured when the ejection orifices are patterned.

If such a light absorbing agent is added to the shape stabilizing layer 7 as to absorb a light (exposing light) having an exposure wavelength, to which the ejection orifice forming layer 14 is exposed, the ejection orifice forming layer can be subjected to exposure treatment without causing the curing of the unexposed portion in the flow-channel side-wall forming layer, even though the flow-channel side-wall forming layer has such light sensitivity as to sense the light exposure for the ejection orifice forming layer. The light absorbing agent to be contained in the shape stabilizing layer can be appropriately selected in consideration of the exposure wavelength for the ejection orifice forming layer. In addition, the content of the light absorbing agent is, for instance, 1 to 10 mass % in the negative photosensitive resin in the ejection orifice forming layer, and can be 1 to 5 mass %.

Figure 2E:
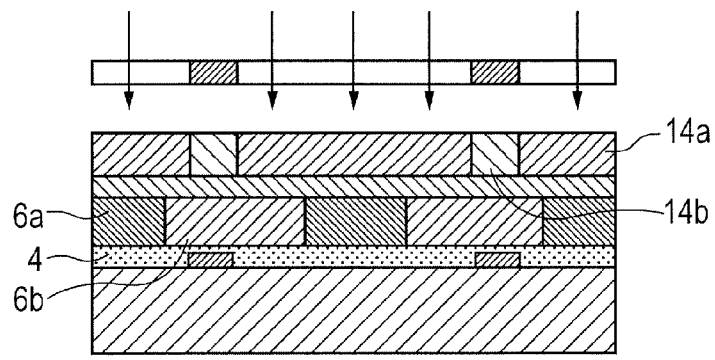

Next, as illustrated in FIG. 2E, a portion other than a region to be the ejection orifice out of the ejection orifice forming layer 14 is exposed to light, and the cured portion 14a and the unexposed portion 14b are optically determined.

In addition, the cationic species, the radical species and the like are produced from the photopolymerization initiator used for the ejection orifice forming layer upon the exposure of the ejection orifice forming layer, and these components cause the exposed portion in the ejection orifice forming layer to cure. In addition, these produced components also diffuse into the shape stabilizing layer as well, and cause a resist portion of the shape stabilizing layer to cure, which shape stabilizing layer corresponds to the exposed region in the ejection orifice forming layer.

For information, a water-repellent film may also be formed on the upper face of the ejection orifice forming layer 14, prior to this step, and then be exposed to light. In this step, the unexposed portion 6b in the flow-channel side-wall forming layer 6 does not cause a curing reaction.

Figure 2F:
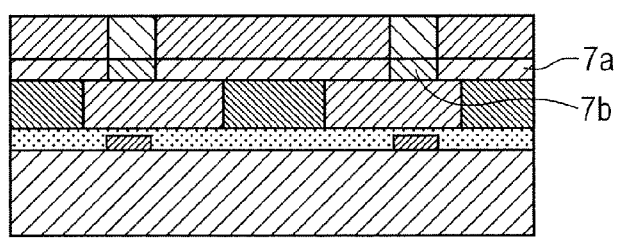

Next, as illustrated in FIG. 2F, the resultant substrate is subjected to heat treatment (PEB) for curing. This heat treatment is arbitrarily conducted, but can be conducted from the viewpoint of the resolution and the like. The component of initiating the polymerization reaction produced in the cured portion 14a which has been formed in FIG. 2E diffuses more effectively into the shape stabilizing layer 7 by this heat treatment to form a cured portion 7a and an uncured portion 7b.

The temperature of the heat treatment is not limited in particular, but is desirably set at such a temperature that the unexposed portion 7b in the flow-channel side-wall forming layer 7 and the unexposed portion 14b in the ejection orifice forming layer 14 are not liquefied, and can be 70 to 100° C.

Figure 2G:
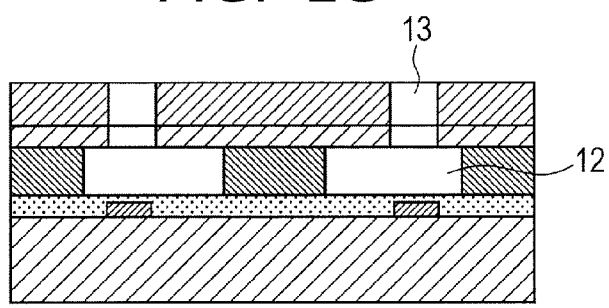

Next, as illustrated in FIG. 2G, the ejection orifice forming layer 14, the shape stabilizing layer 7 and the flow-channel side-wall forming layer 6 are developed.

Here, the ejection orifice forming layer 14, the shape stabilizing layer 7 and the flow-channel side-wall forming layer 6 can be collectively developed. For information, collective development means that all layers are developed by one treatment using one type of a solvent.

In this step, the unexposed portion in the flow-channel side-wall forming layer 6, the uncured portion in the shape stabilizing layer 7 and the unexposed portion in the layer 14 for forming the ejection orifice are developed to form flow channels 12 and ejection orifices 13.

Figure 2H:
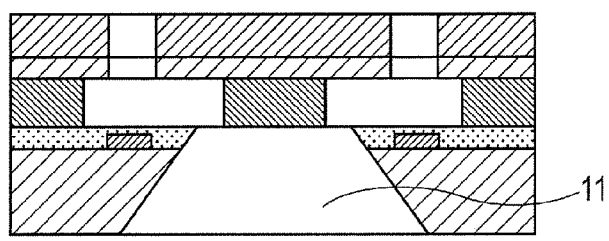

Next, as illustrated in FIG. 2H, an ink supply port 11 is formed, and an insulative protection film 4 of the upper layer of the ink supply port is removed.

Through the above steps, a substrate for a recording head is completed, which has nozzle portions formed thereon for ejecting the ink that has flowed into the ejection orifices 13 from the ink supply port 11 outwardly from the ejection orifices 13. Then, this substrate for the recording head is cut and separated into chips with a dicing saw or the like, electric wiring for driving the ejection energy generating element 2 is bonded to each chip, and then a chip tank member for supplying the ink to the supply port is bonded with the chip. Thereby, the ink jet recording head is completed which functions as a recording head.

In addition, the negative photosensitive resin to be used for the ejection orifice forming layer can employ a material having such light sensitivity as to be capable of selectively forming the ejection orifices without causing the curing of the flow-channel side-wall forming layer. For instance, a sulfonium salt is used as the photopolymerization initiator contained in the flow-channel side-wall forming layer, and an onium salt is used as the photopolymerization initiator contained in the ejection orifice forming layer. Thereby, the light sensitivity ratio of the flow-channel side-wall forming layer and the ejection orifice forming layer can be set at such a large value as 1:6 or more, and the photosensitive resin in the flow-channel side-wall forming layer results in acquiring such a light sensitivity ratio that the photosensitive resin is not cured upon the exposure of the ejection orifice forming layer. In this case, the light exposure for forming the side wall of the flow channel can be set at 6,000 to 10,000 J/m$^2$, for instance, and the light exposure for forming the ejection orifice can be set at 500 to 1,000 J/m$^2$.

In addition, as described above, if the shape stabilizing layer contains a light absorbing agent for absorbing the light having an exposure wavelength to be emitted when the ejection orifice forming layer is exposed to the light, the light sensitivities of the flow-channel side-wall forming layer and the ejection orifice forming layer do not need to be specified, and the selection width of the material is extended.

In addition, the photosensitive resins in the flow-channel side-wall forming layer and the ejection orifice forming layer can be the same type as that of the photosensitive resin in the shape stabilizing layer, in the present embodiment. When the photosensitive resin to be used for the shape stabilizing layer is an epoxy resin, for instance, the photosensitive resin in the flow-channel side-wall forming layer and the ejection orifice forming layer can also be the epoxy resin. The epoxy resin can include a bisphenol A type epoxy resin and a cresol novolak type epoxy resin. When the above resins are formed of the same type of the material, the adhesiveness between each layer is enhanced, and each layer can be collectively developed.

(Exemplary Embodiment 1)

An exemplary embodiment of a method for manufacturing a recording head using a shape stabilizing layer of the present invention will be described below with reference to FIG. 1.

FIGS. 1A to 1D and FIGS. 2E to 2H are schematic sectional views of the recording head, which are taken along the cutting line A-A of FIG. 3.

A plurality of heat generating resistors are arranged as an ejection energy generating element 2 on the surface of a substrate 1 illustrated in FIG. 1A. A silicon substrate was used as the substrate, and TaSiN was used for the heat generating resistor. An insulative protection film 4 was formed by forming a film of SiO or SiN with a plasma CVD method. This film of SiO or SiN plays a role of protecting the electric wiring from ink or other liquids. Firstly, a flow-channel side-wall forming layer 6 was formed on the insulative protection film 4 so as to have a thickness of 14 μm by using a negative photosensitive resin by a spin coating method. A mixture of 100 parts by mass of epoxy resin EHPE3150 (trade name, made by Daicel Chemical Industries, Ltd.) and 6 parts by mass of optical cationic polymerization catalyst SP-172 (trade name, made by Asahi Denka Co., Ltd.) was used for the negative photosensitive resin.

Next, as illustrated in FIG. 1B, a portion to become the side wall of the flow channel out of the flow-channel side-wall forming layer 6 was exposed to an i-line (having wavelength of 365 nm) by using FPA-3000i5+ made by Canon Inc., and a cured portion 6a to become the side wall of the flow channel and an unexposed portion 6b to become the flow channel were optically determined. The light exposure was set at 3,000 J/m$^2$.

Next, as illustrated in FIG. 1C, a shape stabilizing layer 7 was mounted on the flow-channel side-wall forming layer 6 in which the side wall of the flow channel had been optically determined, by using a dry film resist in a vacuum. The thickness of the shape stabilizing layer 7 was 2 μm after the layer 7 was mounted on the layer 6.

The dry film resist used for the shape stabilizing layer is a material which contains an epoxy resin, xylene as a solvent, and an i-line absorbing agent. EHPE3150 (trade name, made by Daicel Chemical Industries, Ltd.) was used as the epoxy resin, and SP-100 (trade name, made by ADEKA CORPORATION) was used as the i-line absorbing agent. The content of the epoxy resin is 96 mass % in a dry film resist, and the content of the i-line absorbing agent is 4 mass % in the dry film resist.

For information, the shape stabilizing layer 7 does not contain a photopolymerization initiator such as a photoinduced cationic polymerization initiator, and accordingly does not have photosensitivity.

Next, as illustrated in FIG. 1D, a layer 14 for forming an ejection orifice which was a negative type of photosensitive dry film was mounted on the shape stabilizing layer 7 in a vacuum. The thickness of the ejection orifice forming layer 14 was 10 μm after the layer 14 was mounted on the layer 7.

The photosensitive dry film is a negative type of photosensitive resin which contains an epoxy resin and a photoinduced cationic polymerization initiator. Epoxy resin EHPE3150 (trade name, made by Daicel Chemical Industries, Ltd.) was used as the photosensitive resin in the ejection orifice forming layer, which was the same material as the resist of the shape stabilizing layer and the photosensitive resin in the flow-channel side-wall forming layer. The photosensitive dry film contains 94 mass % of epoxy resin "EHPE3150" and 6 mass % of photoinduced cationic polymerization catalyst SP-172 (trade name, made by Asahi Denka Co., Ltd.).

In addition, a permanent dry film such as TMMF (trade name, made by TOKYO OHKA KOGYO CO., LTD.) and XP SU-8 3000 (trade name, made by Kayaku MicroChem Corporation), for instance, may also be used as other materials for the ejection orifice forming layer than the above material. In the case, TMMR (trade name, made by TOKYO OHKA KOGYO CO., LTD.) and SU-8 3000 (trade name, made by Kayaku MicroChem Corporation) can be used as the material of the flow-channel side-wall forming layer, from the viewpoint of the adhesiveness.

In addition, PET was used as a base film material. The base film was detached after the dry film was mounted.

Next, as illustrated in FIG. 2E, a region other than the portion to become the ejection orifices out of the ejection orifice forming layer 14 was exposed to an i-line (having wavelength of 365 nm) by using FPA-3000i5+ made by Canon Inc., and a cured portion 14a and an unexposed portion 14b were optically determined. The region was exposed so that the light exposure became 3,000 J/m$^2$.

In this step, the i-line absorbing agent contained in the shape stabilizing layer prevents the light from reaching the flow-channel side-wall forming layer, and accordingly the unexposed portion 6b in the layer 6 for forming the side wall of the flow channel does not cause a polymerization reaction.

Next, as illustrated in FIG. 2F, the exposed region was baked at 90° C. for 5 minutes on a hot plate, as heat treatment (PEB) for curing. The cation which had been produced in the cured portion 6a in the adjacent, flow-channel side-wall forming layer 6 and the cured portion 14a in the ejection orifice forming layer 14 diffused into the shape stabilizing layer 7 to cause a polymerization reaction, and a cured portion 7a and an uncured portion 7b were formed.

Next, as illustrated in FIG. 2G, the unexposed portion 6b in the flow-channel side-wall forming layer 6, the uncured portion 7b in the shape stabilizing layer 7, and the unexposed portion 14b in the ejection orifice forming layer 14 were collectively removed by developing treatment, and an ink flow channel 12 and ejection orifices 13 were formed.

Next, as illustrated in FIG. 2H, an ink supply port 11 was formed by anisotropic etching with the use of an alkali etching liquid. After that, the insulative protection film 4 was removed by dry etching, and the ink supply port 11 was communicated with the flow channel 12.

Through the above steps, the substrate for the recording head is completed, which has nozzle portions formed thereon for ejecting the ink that has flowed into the ejection orifices 13 from the ink supply port 11 outwardly from the ejection orifices 13. Then, this substrate is cut and separated into chips with a dicing saw or the like, electric wiring for driving the ejection energy generating element 2 is bonded to each chip, and then a chip tank member for supplying an ink to the supply port is bonded with the chip. Thereby, the recording head is completed.

As a result of having printed an image with this recording head, it was confirmed that the height of the flow channel did not easily become lower than a desired height. Consequently, refilling properties were enhanced and ink could be ejected at a high speed.

In the present exemplary embodiment, the recording head has an advantage that an i-line absorbing agent is contained in the shape stabilizing layer, and accordingly the sensitivities of the flow-channel side-wall forming layer and the ejection orifice forming layer may not be controlled, which is different from that in Exemplary embodiment 2 that will be described later. For this reason, flexibility for materials is enhanced which are used for the flow-channel side-wall forming layer and the ejection orifice forming layer.

In addition, in the present exemplary embodiment, the shape stabilizing layer which contained the light absorbing agent and did not contain a photopolymerization initiator was formed between the flow-channel side-wall forming layer and the ejection orifice forming layer. Because of this, a method for manufacturing a recording head of the present invention can form the flow channel so as to have a desired height, and can manufacture a recording head which is excellent in refilling properties of a liquid to be ejected, in an adequate yield.

(Exemplary Embodiment 2)

The present exemplary embodiment is different from Exemplary embodiment 1 only in materials of the flow-channel side-wall forming layer 6 formed in FIG. 1A, the shape stabilizing layer 7 formed in FIG. 1C, and the ejection orifice forming layer 14 formed in FIG. 1D. All steps are the same as those in Exemplary Embodiment 1, and accordingly the description will be omitted. In addition, the same reference numeral will be put on the same configuration as in the recording head described in Exemplary Embodiment 1, and the detailed description will be omitted.

In the present exemplary embodiment, the recording head was configured so that a photopolymerization initiator which had higher sensitivity than that of a photopolymerization initiator contained in the flow-channel side-wall forming layer 6 was selected as a photoacid generating agent in the ejection orifice forming layer 14, and an i-line absorbing agent was not added to the shape stabilizing layer 7. Because of this, the unexposed portion 7b in the flow-channel side-wall forming layer 7 is not cured upon exposure for forming the ejection orifices.

A negative photosensitive resin containing an epoxy resin, a photoinduced cationic polymerization initiator and xylene as a solvent was used as a material of the flow-channel side-wall forming layer 6. EHPE3150 (trade name, made by Daicel Chemical Industries, Ltd.) was used as the epoxy resin, and a triarylsulfonium salt was used as the photoinduced cationic polymerization initiator. In the negative photosensitive resin, the content of the epoxy resin was 99 mass %, and the content of the photoinduced cationic polymerization initiator was 1 mass %.

A material containing an epoxy resin and xylene which was the solvent was used as the material of the shape stabilizing layer 7. EHPE3150 (trade name, made by Daicel Chemical Industries, Ltd.) was used as the epoxy resin.

A negative photosensitive resin containing an epoxy resin and a photoinduced cationic polymerization initiator was used as the material of the ejection orifice forming layer 14. EHPE3150 (trade name, made by Daicel Chemical Industries, Ltd.) was used as the epoxy resin, and an onium salt was used as the photoinduced cationic polymerization initiator. In the negative photosensitive resin, the content of the epoxy resin was 99 mass %, and the content of the photoinduced cationic polymerization initiator was 1 mass %.

In order to form the side wall of the flow channel, the portion was exposed to light with a light exposure of 6,000 $J/m^2$ by the same device as that in Exemplary Embodiment 1.

In order to form the ejection orifices, the portion was exposed to light with a light exposure of 1,000 $J/m^2$ by the same device as that in Exemplary Embodiment 1.

As a result of having printed an image with the obtained recording head, it was confirmed that the height of the flow channel did not easily become lower than a desired height. Consequently, refilling properties were enhanced and ink could be ejected at a high speed.

In the present exemplary embodiment, the shape stabilizing layer which did not contain the photopolymerization initiator was formed between the flow-channel side-wall forming layer and the ejection orifice forming layer. Because of this, the method according to the present exemplary embodiment can form the flow channel so as to have a desired height, and can manufacture a recording head which is excellent in refilling properties of a liquid to be ejected, in an adequate yield.

The constitution of the present invention can form the flow channel so as to have a desired height, and can manufacture a recording head which is excellent in refilling properties of a liquid to be ejected at a high speed, in an adequate yield.

While the present invention has been described with reference to exemplary embodiments, it is to be understood that the invention is not limited to the disclosed exemplary embodiments. The scope of the following claims is to be accorded the broadest interpretation so as to encompass all such modifications and equivalent structures and functions.

This application claims the benefit of Japanese Patent Application No. 2011-155733, filed Jul. 14, 2011, which is hereby incorporated by reference herein in its entirety.

What is claimed is:

1. A method for manufacturing a recording head comprising the steps of:
    (1) forming a flow-channel side-wall forming layer which contains a photosensitive resin, on a substrate that has ejection energy generating elements and wiring thereon;
    (2) exposing the flow-channel side-wall forming layer to light, and optically determining a flow channel;
    (3) forming a shape stabilizing layer which contains a photosensitive resin, on the flow-channel side-wall forming layer;
    (4) forming an ejection orifice forming layer which contains a photopolymerization initiator and a negative photosensitive resin, on the shape stabilizing layer;
    (5) exposing the ejection orifice forming layer to light, and optically determining an ejection orifice; and
    (6) developing the ejection orifice forming layer, the shape stabilizing layer, and the flow-channel side-wall forming layer,
    in the order of the steps (1) to (6), wherein
    the photosensitive resin which is contained in the shape stabilizing layer is a material to be cured by a component that is produced upon the exposure of the ejection orifice forming layer and derives from the photopolymerization initiator.

2. The method for manufacturing a recording head according to claim 1, further comprising performing heat treatment after the step (5) and before the step (6).

3. The method for manufacturing the recording head according to claim 1, wherein the shape stabilizing layer contains a light absorbing agent which absorbs a light to which the ejection orifice forming layer is exposed.

4. The method for manufacturing a recording head according to claim 1, wherein the photosensitive resin in the flow-channel side-wall forming layer and the photosensitive resin in the ejection orifice forming layer are the same type as the photosensitive resin in the shape stabilizing layer.

5. The method for manufacturing a recording head according to claim 4, wherein the shape stabilizing layer is collectively developed with the flow-channel side-wall forming layer and the ejection orifice forming layer in the step (6).

6. The method for manufacturing a recording head according to claim 1, wherein the shape stabilizing layer is formed by using a dry film.

* * * * *